US006327855B1

(12) United States Patent
Hill et al.

(10) Patent No.: US 6,327,855 B1
(45) Date of Patent: Dec. 11, 2001

(54) ACTUATORS INCLUDING SERPENTINE ARRANGEMENTS OF ALTERNATING ACTUATING AND OPPOSING SEGMENTS AND RELATED METHODS

(75) Inventors: Edward A. Hill, Chapel Hill; Vijayakumar Rudrappa Dhuler, Raleigh, both of NC (US)

(73) Assignee: JDS Uniphase Inc., San Jose, CA (US)

( * ) Notice: Subject to any disclaimer, the term of this patent is extended or adjusted under 35 U.S.C. 154(b) by 0 days.

(21) Appl. No.: 09/498,100

(22) Filed: Feb. 4, 2000

(51) Int. Cl.⁷ ................................................. F01B 29/10
(52) U.S. Cl. ........................................ 60/528; 60/527
(58) Field of Search ........................... 60/527, 528, 529

(56) References Cited

U.S. PATENT DOCUMENTS

| | | | |
|---|---|---|---|
| 5,903,380 | 5/1999 | Motamedi et al. | 359/224 |
| 6,044,646 | * 4/2000 | Silverbrook | 60/528 |
| 6,067,797 | * 5/2000 | Silverbrook | 60/529 X |
| 6,070,851 | * 6/2000 | Tsai et al. | 60/529 X |

FOREIGN PATENT DOCUMENTS

| | | | |
|---|---|---|---|
| 0875780 A2 | 11/1998 | (EP) | G02B/26/08 |
| WO 99/24783 | 5/1999 | (WO) | G01B/7/004 |

OTHER PUBLICATIONS

Manalis, Scott Robert, *Optical Detection for Microfabricated Cantilever Arrays*, Dissertation (1998).
Elwenspoek, M., et al., Active joints for microrobot limbs, *J. Micromech. Microeng.*, vol. 2, pp. 221–223 (1992).
Lin, G., et al., Design, Fabrication, and Testing of a C–Shape Actuator, The 8th International Conference on Solid–State Sensors and Actuators, and Eurosensors, pp. 416–419 (Stockholm, Sweden, Jun. 25–29, 1995).
Suh, John W., et al., Organic thermal and electrostatic ciliary microactuator array for object manipulation, *Sensors and Actuators A*, vol. 58, pp. 51–60 (1997).
Lin, Yuh–Sheng, et al., Thermally Actuated Bimorph Microactuators, *Journal of the Chinese Society of Mechanical Engineers*, vol. 18, No. 6, pp. 525–531 (1997).
Sun, Xi–Qing, et al., A Bistable Microrelay Based on Two–Segment Multimorph Cantilever Actuators, *The Eleventh Annual International Workshop on Micro Electro Mechanical Systems, IEEE*, pp. 154–159 (1998).
Calmes, S., et al., Resonating Large Angle and Low Consumption Micromachined Optical Scanner, *SPIE*, vol. 3276, pp. 96–102 (1998).
Motamedi, M. Edward, et al., Development of micro–electro–mechanical optical scanner, *Opt. Eng.*, vol. 36, pp. 1346–1353 (May 1997).
Motamedi, M. E., et al., MOEM scan engine for bar code reading and factory automation, *SPIE*, vol. 3276, pp. 66–80 (1998).

* cited by examiner

*Primary Examiner*—Hoang Nguyen
(74) *Attorney, Agent, or Firm*—Myers Bigel Sibley & Sajovec

(57) ABSTRACT

A micromechanical system can include a substrate, an actuator, and an actuated element. In particular, the actuator can include a serpentine arrangement of alternating actuating and opposing segments anchored at a first end thereof to the substrate wherein the actuating segments deflect in response to actuation thereof so that a second end of the serpentine arrangement moves relative to the substrate upon deflection of the actuating segments. The actuated element is attached to the second end of the serpentine arrangement so that the actuated element moves relative to the substrate upon deflection of the actuating segments. Related methods and actuators are also discussed.

54 Claims, 7 Drawing Sheets

ACTUATORS INCLUDING SERPENTINE ARRANGEMENTS OF ALTERNATING ACTUATING AND OPPOSING SEGMENTS AND RELATED METHODS

BACKGROUND OF THE INVENTION

The present invention relates to the field of mechanical systems and methods and more particularly, to mechanical actuators and methods.

Bimorph microactuators are discussed, for example, in the reference by M. Edward Motamedi et al. entitled Development Of Micro-Electro-Mechanical Optical Scanner. (Opt. Eng. 36(5) 1346–1353, May 1997.) In particular, bimorph microactuators are micromachined beams whose curvatures can be controlled by applying electrical signals. The simplest bimorph actuator is a composite beam with different structural and electrical properties in its individual layers. The behavior of a bimorph actuator can depend on the dimensions, densities, elastic coefficients, thermal expansion coefficients, and/or piezoelectric properties of the individual layers making up the beam.

The use of a bimorph actuator beam in a monolithic silicon integrated optical micro-scanner is discussed in the reference by S. Calmes et al. entitled Resonating Large Angle And Low Consumption Micromachined Optical Scanner. (SPIE Vol. 3276, pp. 96–102, 1998.) In this reference, the device includes a mirror located on the tip of a thermal bimorph actuator beam. The device is excited electrothermomechanically at its resonance frequency, enabling large angular deflections at low power consumption. Additional bimorph actuator structures are discussed in the reference by Xi-Qing Sun et al. entitled A Bistable Microrelay Based On Two-Segment Multimorph Cantilever Actuators (Proceedings of the IEEE Micro Electro Mechanical Systems, 1998, pp. 154–159). The disclosures of each of the Motamedi et al., Calmes et al., and Sun et al. references are hereby incorporated herein in their entirety by reference.

Notwithstanding the bimorph actuators discussed above, there continues to exist a need in the art for improved actuators and methods of forming the same.

SUMMARY OF THE INVENTION

An actuator according to the present invention may comprise a serpentine arrangement of alternating actuating and opposing segments wherein the actuating segments deflect in response to actuation thereof. In particular, the actuating segments may bend or deflect in a first direction during actuation while the opposing segments do not deflect significantly or deflect in a direction opposite that of the actuating segments. The opposing segments can thus increase an overall deflection of the actuator without increasing the length of the actuating segments. Moreover, the actuator is scalable so that a greater deflection can be achieved by adding additional alternating actuating and opposing segments. By providing opposing segments to deflect in a direction opposite that of the actuating segments, greater deflections can be obtained. Alternately, the opposing segments may deflect in the same direction as the actuating segments but to a lesser degree.

A micromechanical system according to the present invention can include a substrate, an actuator, and an actuated element. In particular, the actuator can include a serpentine arrangement of alternating actuating and opposing segments anchored at a first end thereof to the substrate wherein the actuating segments deflect in response to actuation thereof so that a second end of the serpentine arrangement moves relative to the substrate upon deflection of the actuating segments. The actuated element is attached to the second end of the serpentine arrangement so that the actuated element moves relative to the substrate upon deflection of the actuating segments.

More particularly, each of the actuating segments may comprise a bimorph segment including a first layer of a first material having a first coefficient of thermal expansion and a second layer of a second material having a second coefficient of thermal expansion different than the first coefficient of thermal expansion so that the actuating segments deflect in response to changes in temperature thereof. In addition, the alternating actuating and opposing segments may comprise parallel beams, and a second end of the serpentine arrangement may rotate about an axis perpendicular to the parallel beams. The substrate may also include a trench therein adjacent the serpentine arrangement to reduce interference with the actuator.

The system may also include a second actuator including a second serpentine arrangement of alternating actuating and opposing segments anchored at a first end thereof to the substrate. The actuating segments of the second actuator may deflect in response to actuation thereof so that a second end of the second serpentine arrangement moves relative to the substrate upon deflection of the actuating segments, and the second end of the second serpentine arrangement can be attached to the actuated element. In addition, the system may include an electrical path between the respective second ends of the first and second serpentine arrangements of the respective first and second actuators, and a signal generator. The signal generator can be coupled between the first ends of the first and second serpentine arrangements of the respective first and second actuators so that an electrical signal generated by the signal generator actuates the actuating segments of the first and second serpentine arrangements.

Actuators, systems, and methods according to the present invention can thus provide increased ranges of rotation and/or motion in micromechanical systems.

DETAILED DESCRIPTION

Figure 1:
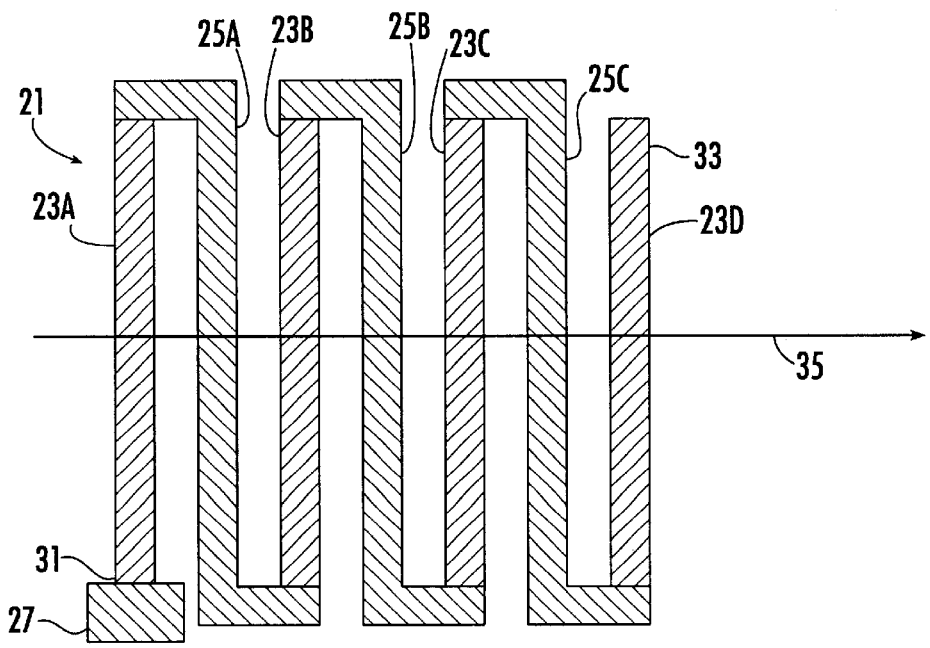
FIG. 1 is a plan view of an actuator according to the present invention.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present. Also, when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

An actuator 21 according to the present invention can include a serpentine arrangement of alternating actuating segments 23A–D and opposing segments 25A–C as shown in FIG. 1, wherein the actuating segments 23A–D deflect in response to actuation thereof. According to a particular embodiment of the present invention, each actuating segment 23 comprises a bimorph segment including a layer of a first material having a having a first coefficient of thermal expansion and a second layer of a second material having a second coefficient of thermal expansion different that the first coefficient of thermal expansion. A deflection of the bimorph segments can thus be induced by changing the temperatures thereof. Alternately, actuation can be provided based on other properties of layers used in the actuating segments such as dimensions, densities, elastic coefficients, thermal expansion coefficients, and/or piezoelectric properties of the individual layers making up the actuating segments.

In contrast, the opposing segments 25A–C provide relatively little deflection upon actuation of the actuating segments 23A–D. According to a particular embodiment, each actuating segment 23 can comprise a monomorph segment including a layer of a single material so that the opposing monomorph segments 25A–C do not significantly deflect upon actuation of the actuating segments 23A–D. More particularly, an actuator 21 including actuating bimorph segments with layers of different coefficients of thermal expansion and opposing monomorph segments with a layer of a single material can be heated so that the actuating bimorph segments deflect in response to changes in temperature, while the opposing monomorph segments do not significantly deflect in response to changes in temperature. While other structures are within the scope of the present invention, an actuator structure including actuating bimorph segments and opposing monomorph segments will be discussed in greater detail as a particular embodiment of the present invention. Those having skill in the art, however, will understand that this is done for the purposes of illustration and that the particular examples discussed herein do not limit the scope of the invention set forth in the claims.

Figure 2:
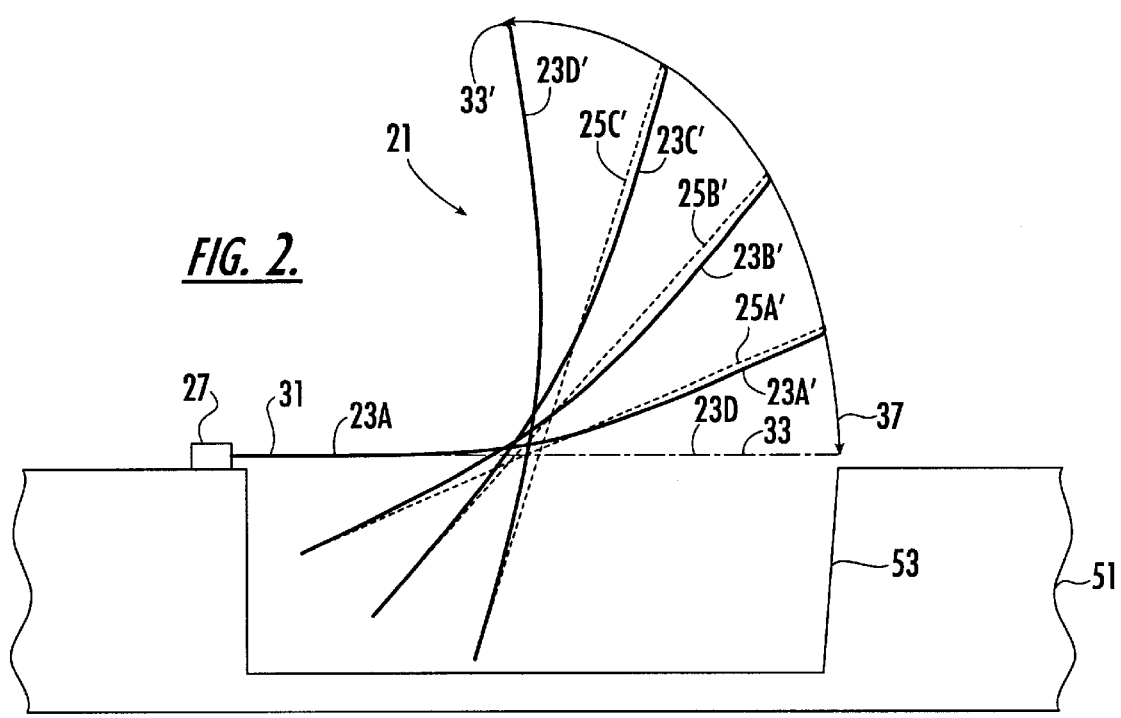
FIG. 2 is a cross-sectional representation of a first actuator according to the present invention in the actuated state.

In the actuator illustrated in FIG. 1, a first end 31 of the serpentine arrangement can be anchored to a substrate (shown in FIG. 2) at an anchor 27 so that the first end 31 of the serpentine arrangement is fixed relative to the substrate while a second end 33 of the serpentine arrangement is free of the substrate. Accordingly, the second end 33 of the serpentine arrangement can thus rotate along the arc 37 around the axis 35 when the actuator is actuated as shown in FIG. 1 and the cross sectional view of FIG. 2. In FIG. 2, the line 23D (illustrated as a line of alternating dots and dashes) represents the position of the actuating segment 23D as well as the actuating segments 23A–C and the opposing segments 25A–C when the actuator is not actuated. In other words, all of the actuating and opposing segments can lie in a common plane when the actuator is not actuated, and this common plane may be parallel with a surface of a substrate 51 to which the first end 33 is anchored. Moreover, a trench 53 may be provided in the substrate 51 to provide clearance for the serpentine arrangement during actuation.

The positions of each of the actuating and opposing segments upon actuation are illustrated in FIG. 2 using references 23A'–23D' and 25A'–25C'. As shown, each of the actuating segments 23A'–23D' (represented with solid lines) bends or deflects away from the substrate upon actuation thereof, while each of the opposing segments 25A'–25C' (represented with dashed lines) maintains a relatively straight orientation. By maintaining relatively straight opposing segments in the serpentine arrangement, the angular displacement of the free end 33–33' can be increased without increasing the length of the actuating segments. In other words, the angular displacement of the free end 33–33' can be increased by increasing the number of alternating actuating and opposing segments in the serpentine arrangement without increasing the length of the actuating or opposing segments.

In contrast, a single linear actuating segment of similar cross-section might need to be significantly longer than the actuating segments of FIGS. 1 and 2 to obtain a similar angular displacement at a free end thereof. In addition, such a longer linear actuating segment might generate a significantly greater lateral displacement of the free end 33 with respect to the substrate 51 to provide the same angular displacement of the free end as is provided by the serpentine arrangement of FIGS. 1 and 2. When compared with a single linear actuator, the serpentine arrangement of FIGS. 1 and 2 can provide a desired angular displacement in an actuator having a reduced length while also reducing a lateral displacement used to achieve the desired angular displacement. Moreover, the serpentine arrangement of FIGS. 1 and 2 may be able to provide angular displacements that may be unattainable by a single linear actuating segment of any length.

As will be discussed in greater detail below, the actuating segments 23 can be provided using a bimorph structure including layers of materials having different coefficients of thermal expansion while the opposing segments can be provided using a monomorph structure including a single layer of a material. The opposing segments can alternately be provided by multi-layered segments providing the characteristics discussed in greater detail below. Upon heating, the actuating bimorph segments bend or deflect due to the differences in coefficients of thermal expansion while the opposing monomorph segments do not significantly bend or deflect. Heat can be provided by joule heating such as generated by driving a current through the serpentine arrangement. Actuation can thus be controlled by controlling the current through the serpentine structure. Alternately or in addition, a heating element can be provided adjacent to the serpentine arrangement, and/or ambient heating can be used to actuate the serpentine arrangement.

Figure 3:
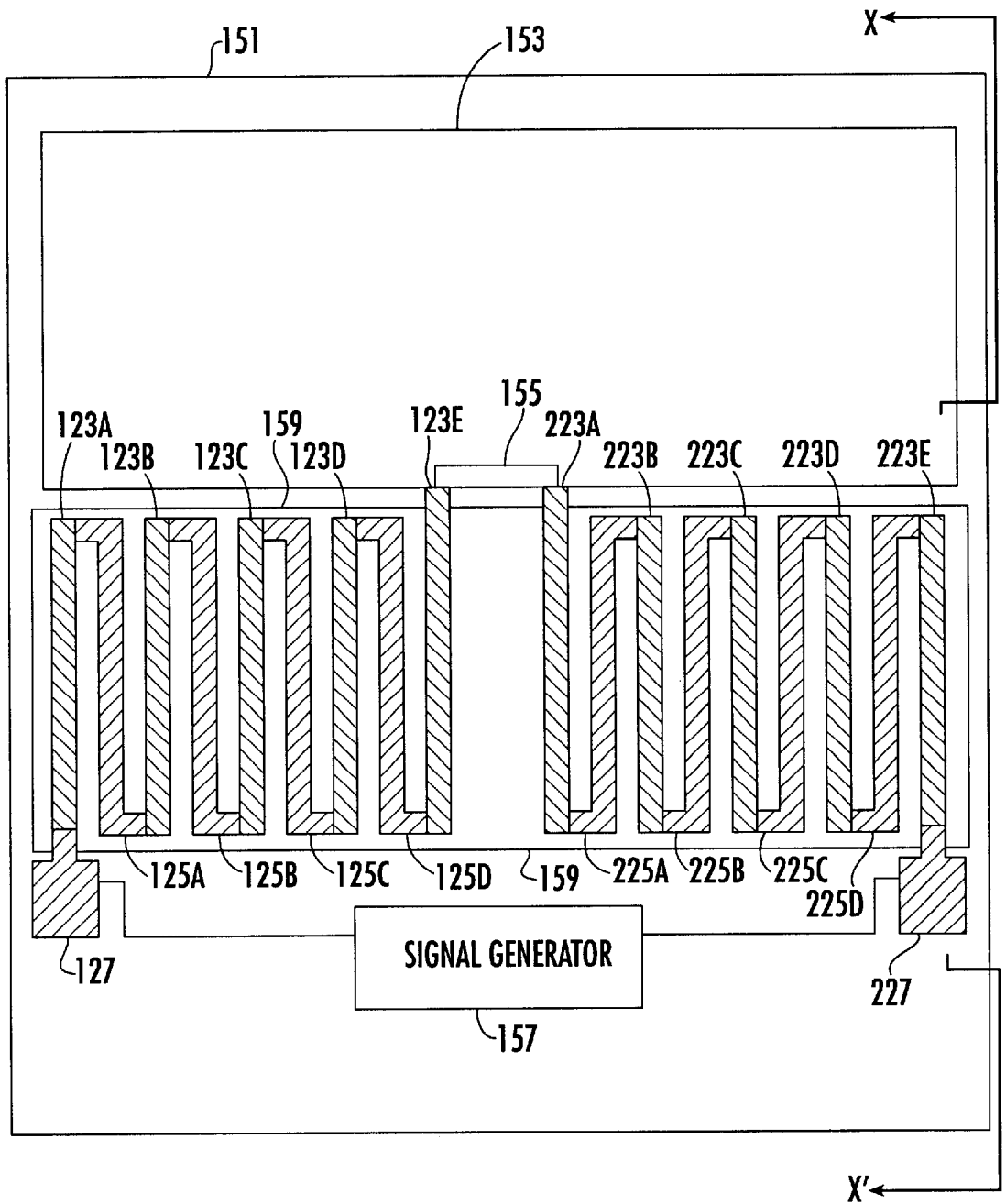
FIG. 3 is a plan view of a micromechanical system including two actuators according to the present invention.

An example of a microelectromechanical system including a pair of actuators and an actuated element according to the present invention is illustrated in FIG. 3. In particular, a first actuator includes a first serpentine arrangement of actuating segments 123A–E and opposing segments 125A–D, and a second actuator includes a second serpentine arrangement of actuating segments 223A–E and opposing segments 225A–D. First and second anchors 127 and 227 anchor respective ends of the first and second serpentine arrangements to the substrate 151. Opposing ends of the first and second serpentine arrangements are coupled with an actuated element 153 such as a mirror.

The first and second serpentine arrangements of actuating and opposing segments are electrically coupled through an electrical path 155 on the actuated element 153. The electrical path 155 can be a conductive line formed separately on the actuated element 153. Alternately, the actuated element 153 may be formed of a conductive material so that the actuated element itself provides the electrical path 155. Accordingly, an electrical signal generated by the signal generator 157 can be used to drive a current through the first serpentine arrangement of actuating 123A–E and opposing 125A–D segments, the electrical path 155 and the second serpentine arrangement of actuating 223A–E and opposing 225A–D segments, A current driven by the signal generator 157 can thus be used to heat the actuating segments 123A–E and 223A–E to effect actuation thereof. In particular, actuating segments comprising layers of two materials having different coefficients of thermal expansion can be heated by driving a current therethrough.

When no current is driven through the actuating segments, the actuating segments 123A–E and 223A–E, the opposing segments 125A–D and 225A–D, and the actuated element 153 may thus lie in a common plane parallel to a surface of the substrate 151. The actuated element 153 can be rotated away from the substrate by driving a current through the actuating segments to heat the actuating segments so that the actuating segments bend or deflect away from the substrate. As discussed above, the opposing segments maintain a relatively straight orientation to thereby increase the rotation of the actuated element. By turning the current off through the actuating segments, the actuating segments will cool and return to the non-actuated positions parallel to the substrate.

The substrate 151 may also include a trench 159 therein adjacent the serpentine arrangements of actuating (123A–E and 223A–E) and opposing (125A–E and 225A–E) segments to provide clearance therefor. As discussed above with respect to FIG. 2, the opposing segments may rotate back toward the substrate. By providing the trench 159, interference from the substrate can be reduced.

Figure 4A:
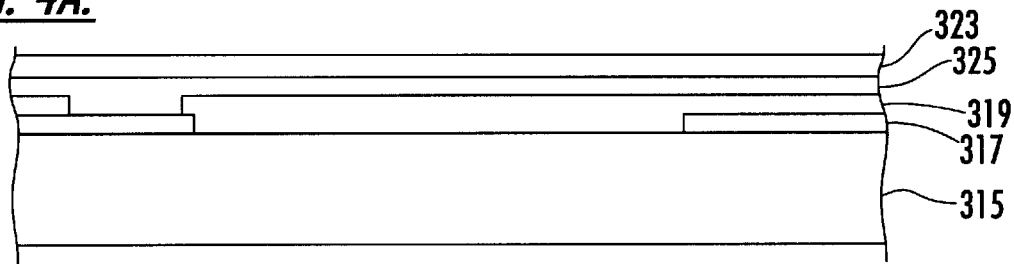
FIGS. 4A–D are cross-sectional views illustrating steps of forming the micromechanical system of FIG. 3 along section line XX'.

The cross-sectional views of FIGS. 4A–D illustrate steps of fabricating the system of FIG. 3. In particular, a semiconductor substrate 315, such as a silicon substrate, can be provided, and a masking layer 317 such as a silicon nitride layer can be formed thereon. The masking layer 317 is patterned as shown in FIG. 4A to define an area of the substrate in which a trench 159 can be subsequently formed. The semiconductor substrate 315 and the patterned masking layer 317 can together define the substrate 151 illustrated in FIG. 3.

A sacrificial layer 319 can be formed on the substrate including the masking layer 317 and patterned as shown in FIG. 4A. In particular, the sacrificial layer can be patterned to define the anchor for the serpentine arrangements of actuating and opposing segments. The sacrificial layer can then be used as a base on which to form the serpentine arrangements of actuating and opposing segments and the actuated element. The sacrificial layer can subsequently be removed to free the actuating and opposing segments from the substrate. After forming the sacrificial layer, the conductive layers 323 and 325 are formed on the sacrificial layer 319 wherein the conductive layers preferably have different characteristics (such as different coefficients of thermal expansion). For example, the first conductive layer 325 can be a 2 micron thick layer of gold, and the second conductive layer 323 can be a 2 micron thick layer of aluminum.

Figure 4B:
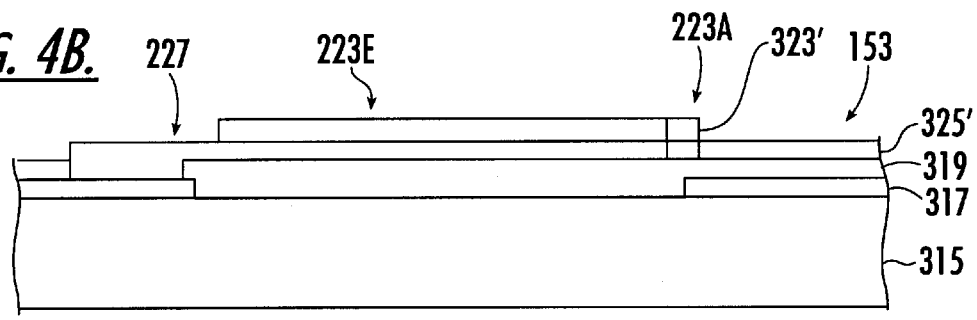
Figure 4C:
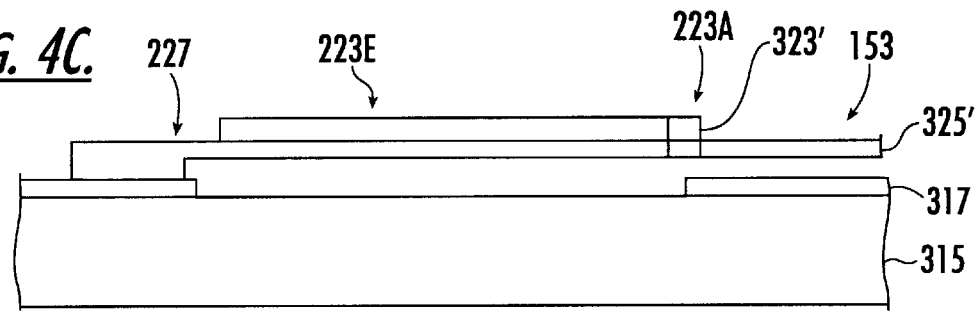
Figure 4D:
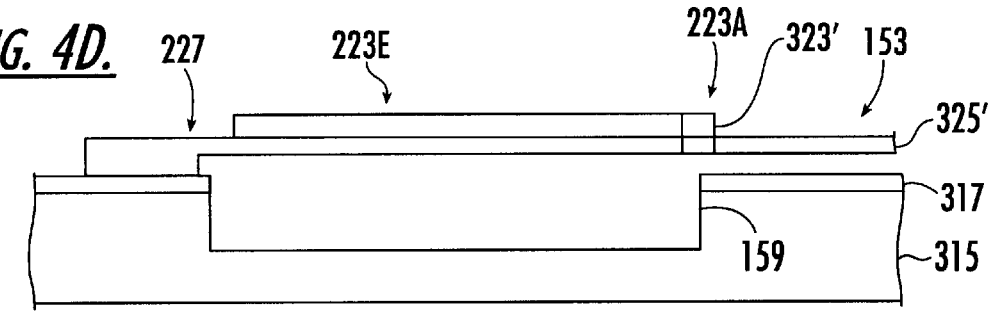

The second conductive layer 323 is then patterned to provide the patterned conductive layer 323' defining the upper layer of the actuating segments 123A–E and 223A–E as shown in FIG. 4B. After patterning the second conductive layer, the first conductive layer 325 is patterned to provide the patterned conductive layer 325' defining the opposing segments 123A–E and 223A–E, the actuated element 153, and the lower layer of the actuating segments 123A–E and 223A–E as also shown in FIG. 4B. The sacrificial layer 319 is then removed to free the patterned conductive layer 325' from the substrate except at anchor 227 as shown in FIG. 4C. Once the sacrificial layer is removed, the trench 159 can be formed in portions of the semiconductor substrate 315 exposed by the masking layer 317 as shown in FIG. 4D to reduce interference with the actuator as discussed above.

The steps discussed above with regard to FIGS. 4A–D can thus be used to provide a serpentine arrangement of actuating and opposing segments wherein each actuating segment comprises a layer of aluminum on a layer of gold, and wherein each opposing segment comprises only a layer of gold. Moreover, the actuated element can comprise a layer of gold. The difference between the coefficients of thermal expansion of gold and aluminum causes the actuating segments to bend or deflect away from the substrate when heated. While the opposing segments comprising only a layer of gold may expand/contract when heated/cooled, the opposing segments will not significantly bend or deflect because of the uniformity of thermal expansion/contraction.

Finite-element modeling has been performed for a single actuator having the structure illustrated in FIG. 3. In particular, finite-element modeling was performed for an actuator having a serpentine arrangement including five 500 micron long by 25 micron wide beam elements made of a stack of 2 micron aluminum on 2 micron gold. The model used predicts that rotations of 45 degrees for a 100° K. temperature change can be achieved with this structure.

While aluminum and gold are discussed above as examples of conductive materials with different coefficients of thermal expansion, other materials with different coefficients of thermal expansion may also be used. For example, other metals and/or polysilicon may be used for one or both of the layers used to form the segments of the serpentine arrangement. Alternately, one of the layers may be electrically insulating. For example, the second layer 323 may be electrically insulating while the first conductive layer 325 provides the conductive path. If a separate heating element or ambient temperature changes are used to actuate the actuating segments, an electrically conductive path through the segments may not be required. As previously discussed, characteristics other than thermal expansion can also be used to provide actuation of the actuating segments according to the present invention.

Figure 5A:
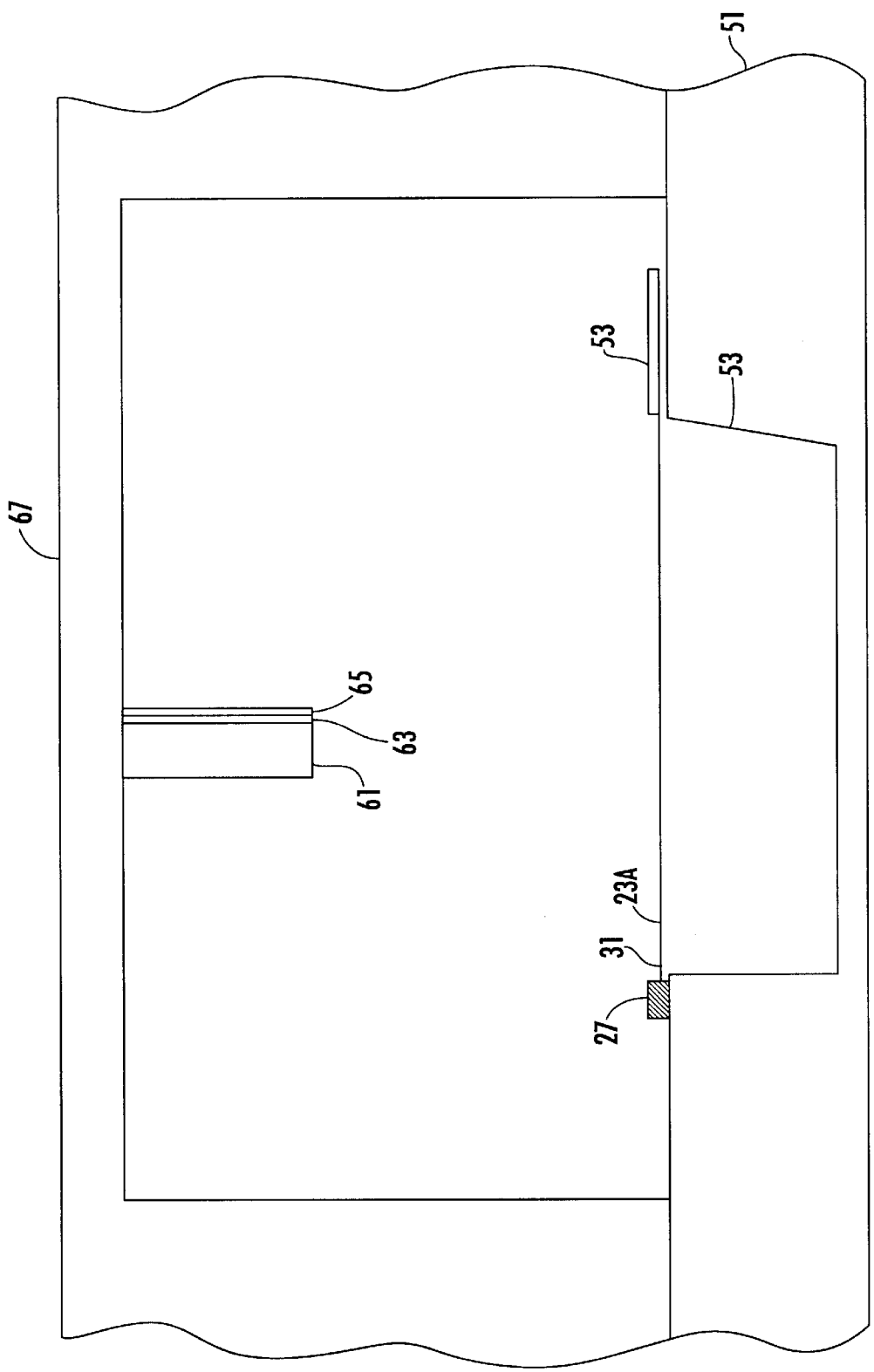
FIGS. 5A–B are cross-sectional views illustrating a micromechanical system including an electrostatic clamp and an actuator according to the present invention.
Figure 5B:
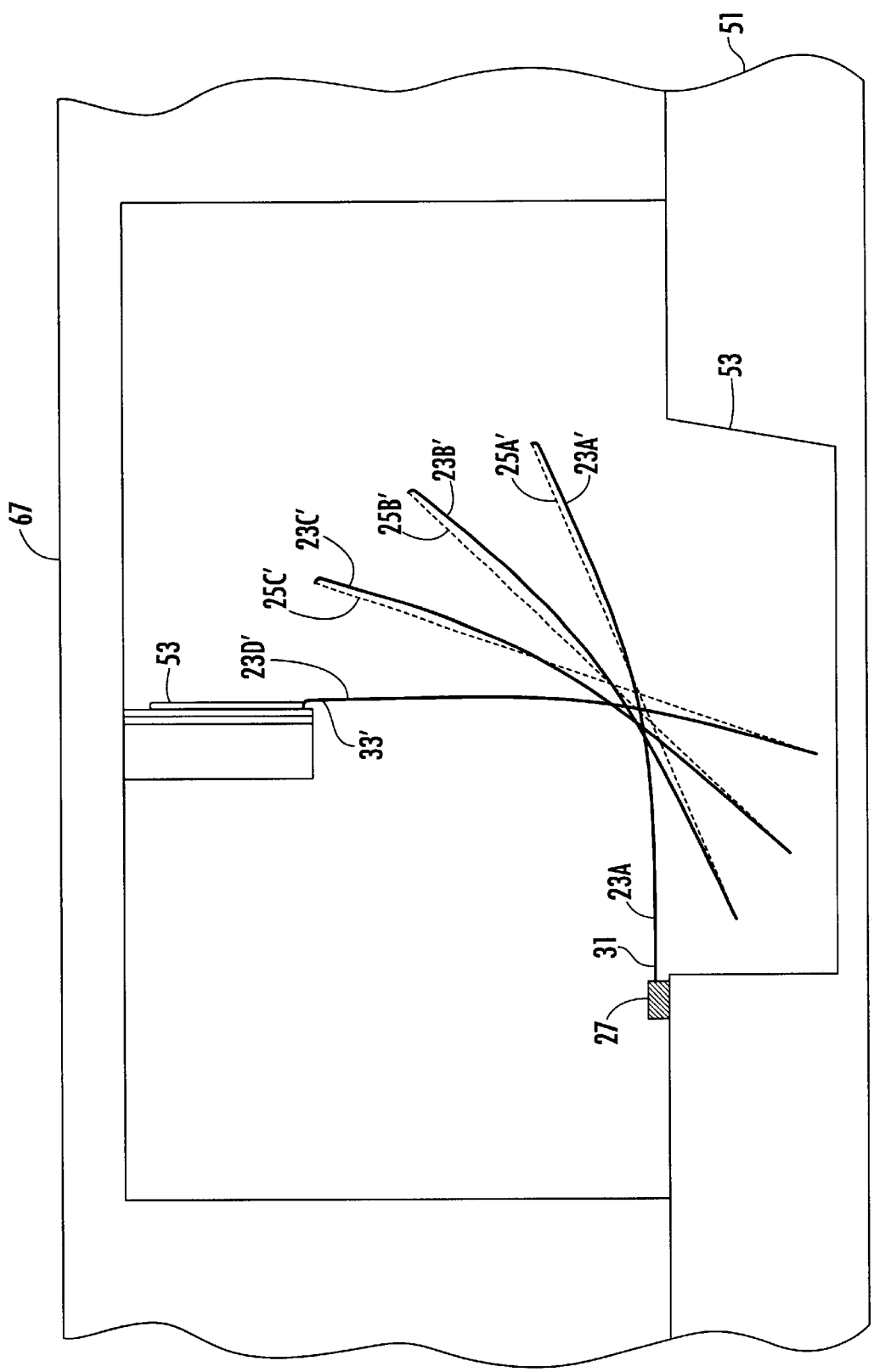

Another aspect of the present invention is illustrated in FIGS. 5A and 5B. As shown, the actuated element 53 can rotate between a first position parallel with the substrate shown in FIG. 5A and a second position perpendicular to the substrate shown in FIG. 5B under control of an actuator including the serpentine arrangement discussed above with regard to FIGS. 1 and 2. In the structure of FIGS. 5A and 5B, an electrostatic clamp can be used to maintain the actuated element in the second position of FIG. 5B while shutting off power to the actuator.

In particular, the actuator provides for rotation of the actuated element 53 to the perpendicular position upon heating as discussed above with reference to FIGS. 1–4. More particularly, the actuator can be heated by driving an electrical current therethrough so that the actuated element is maintained in the second position as long as the current is maintained through the actuator. An excessive amount of power may be consumed, however, if the actuated element is maintained in the second position for any length of time.

Accordingly, an electrostatic clamp may be provided to maintain the actuated element in the second position while shutting off current through the actuator. In particular, the clamp can be provided using a clamp post 61 with a clamp electrode 63 having a dielectric layer 65 thereon. When the actuated element contacts the clamp post 61 including the clamp electrode 63, a potential difference between the electrode 63 and the actuated element 63 is used to electrostatically clamp the actuated element 53 into position. Once the actuated element 53 is clamped, the current through the actuator can be turned off thus saving power. Because the electrostatic clamp uses an electrostatic charge to clamp the actuated element, little on no current is consumed by the clamp so that little power is consumed to maintain the actuated element 53 in the actuated position. Once the electrostatic clamp is turned off, the actuator and actuated element will return to the non-actuated position parallel to the substrate due to the spring-like nature of the actuator.

As shown in FIGS. 5A and 5B, the clamp post 61 can be supported on a second substrate 67 bonded to the first substrate 51. Alternately, a clamp post could be supported on the first substrate 51 thus eliminating the need to bond a second substrate. According to yet another alternative, an electrostatic clamp electrode could be provided on the substrate 51 to clamp the actuated element in the position of FIG. 5A parallel to the substrate 51. While not explicitly shown in the cross-sectional views of FIGS. 5A and 5B, it will be understood that two actuators can be used to actuate the actuated element 53 in a manner similar to that illustrated in FIGS. 3 and 4A–D.

Figure 6:
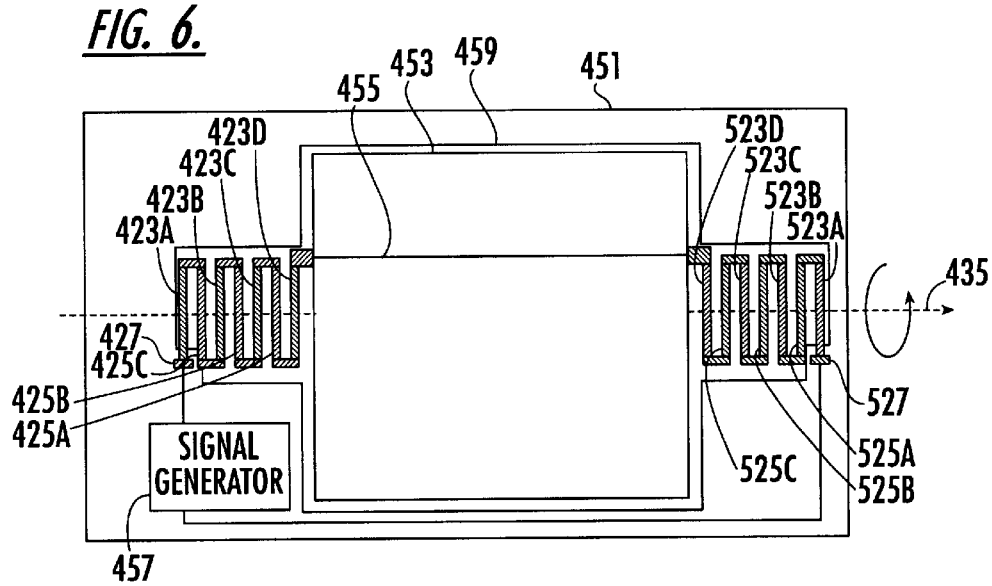
FIGS. 6 and 7 are plan views illustrating two additional micromechanical systems including actuators according to the present invention.
Figure 7:
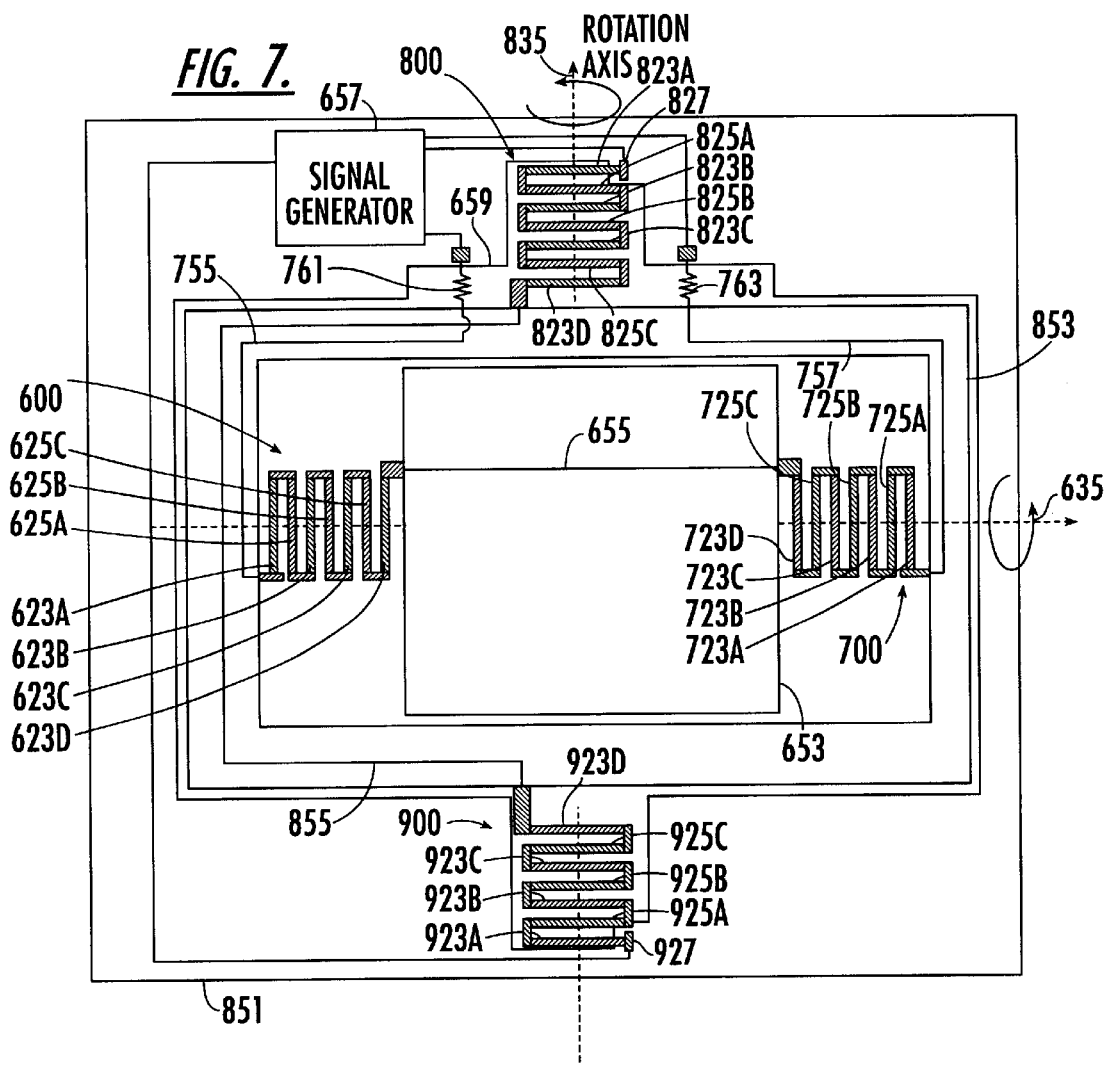

Top views of two additional systems including actuators according to the present invention are illustrated in FIGS. 6 and 7. In the system of FIG. 6, a pair of actuators each comprising a serpentine arrangement of actuating (423A–D and 523A–D) and opposing (425A–C and 525A–C) segments are provided on opposite sides of an actuated element 453 to provide rotation of the actuated element 453 about an axis 435 through the actuated element 453. As shown, anchors 427 and 527 secure one end of each of the actuators to the substrate 451, and a trench 459 in the substrate provides clearance for the actuators and the actuated element 453. As discussed above, a signal generator 457 can be used to heat the actuating segments by driving an electrical current through the actuators and the electrical path 455 therebetween. As discussed above, the electrical path 455 can be provided by the actuated element itself if the actuated element is electrically conductive, or the electrical path 455 can be provided by a conductive line formed on the actuated element 453.

The system of FIG. 7 uses a first pair of actuators to rotate an actuated element 653 about a first axis 635 relative to a gimbal 753 and a second pair of actuators to rotate the gimbal 753 about a second axis 735 relative to a substrate 851. As shown, the first pair of actuators 600 and 700 include respective actuating (623A–D and 723A–D) and opposing (625A–C and 725A–C) segments in serpentine arrangements, and the second pair of actuators 800 and 900 include respective actuating (823A–D and 923A–D) and opposing (825A–C and 925A–C) segments in serpentine arrangements. Moreover, these actuators operate as discussed above with regard to FIGS. 1–4. For example, a signal generator 657 can be used to drive electrical current through the pairs of actuators to rotate the gimbal 853 and the actuated element 653.

The actuators 600 and 700 can be electrically coupled through an electrical path 655 across the actuated element 653. As discussed above, the electrical path 655 can be provided by the actuated element if the actuated element is electrically conductive or by a conductive line formed on the actuated element. The actuators 600 and 700 can be respectively coupled to the signal generator 657 through electrical paths 755 and 757 across the gimbal and through the conductive straps 761 and 763 providing electrical coupling from the gimbal 853 to the signal generator 657. The electrical paths 755 and 757 can be provided as portions of the gimbal if the gimbal is formed of a conductive material, or the electrical paths 755 and 757 can be provided as conductive lines formed on the gimbal 853. The conductive straps 761 and 763 are preferably flexible to provide an electrical coupling without significantly diminishing rotation of the gimbal 853. More particularly, the conductive straps are each anchored at one end to the substrate at anchors 727 and 729 and at the opposing end at the gimbal, and the conductive straps span the trench 659 therebetween. As shown, the conductive straps can also have a serpentine shape to further increase flexibility thereof.

The actuators 800 and 900 can be electrically coupled through an electrical path 855 across the gimbal 853. The electrical path 855 can be provided by the gimbal if the gimbal is electrically conductive, or the electrical path 855 can be provided by a conductive line formed on the gimbal. As shown, the actuators 800 and 900 can be anchored to the substrate using anchors 827 and 927, and electrical coupling with the signal generator 657 can be provided through the respective anchors 827 and 927.

In the examples discussed above, the actuating segments each deflect or bend to provide rotation about the axis about which the actuated element is to be rotated, while the opposing segments amplify the rotation by not deflecting or bending. In other words, the opposing segments provide amplification of the rotation of the actuator due to the serpentine arrangement of the alternating actuating and opposing segments. Further amplification of the rotation can be provided if the opposing segments bend or deflect in a direction opposite to the direction that the actuating segments bend or deflect. In this context, the opposing segments may be considered non-actuating in the sense that they bend or deflect in a direction opposite to that of the actuated segments. Accordingly, the term opposing segment includes segments that do not bend or deflect upon actuation of the serpentine actuator, segments that bend or deflect in a direction opposite to that of the actuating segments upon actuation of the serpentine actuator, and segments that bend in the same direction as the actuating segments but to a lesser degree.

Figure 8:
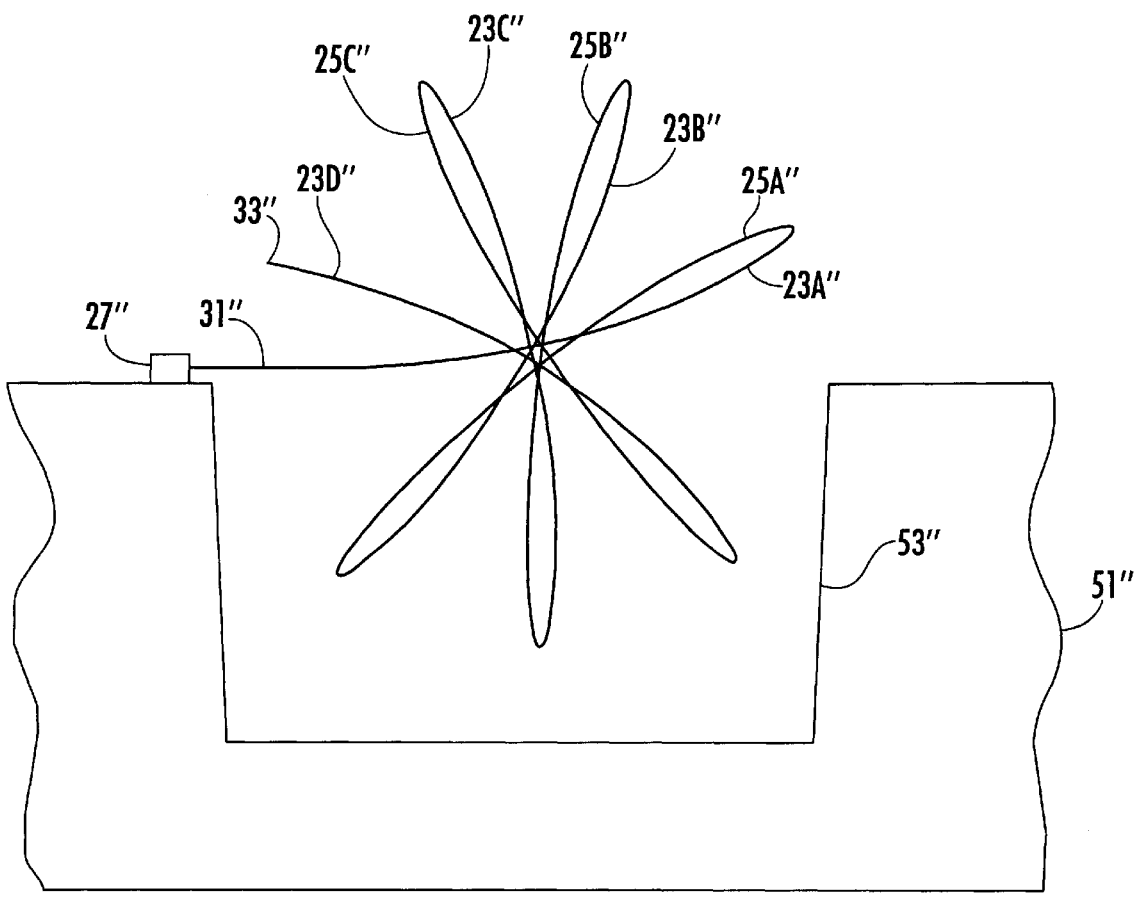
FIG. 8 is a cross-sectional representation of a second actuator according to the present invention.

FIG. 8 illustrates an example of an actuator including a serpentine arrangement of actuating segments 23A"–23D" that bend or deflect in a first direction away from the substrate 51" and opposing segments 25A"–C" that bend or deflect in a second direction toward the substrate opposite the first direction. This operation can be provided by a structure wherein the actuating segments 23A"–23D" have a bimorph structure such that heating results in a deflection or bending away from the substrate, and wherein the opposing segments 25A"–25C" have a bimorph structure such that heating results in a deflection or bending toward the substrate. In other words, the actuating segments can comprise first and second layers wherein the first layer adjacent the substrate has a higher coefficient of thermal expansion than the second layer opposite the substrate, and the opposing segments can comprise third and fourth layers wherein the third layer adjacent the substrate has a lower coefficient of thermal expansion than the fourth layer opposite the substrate. For example, the first and fourth layers can comprise a common material such as gold, and the second and third layers can comprise a common material such as aluminum. Moreover, the second and third layers can be patterned from a common layer of aluminum so that three deposition and patterning steps can be used to form the actuating and opposing segments.

The actuator of FIG. 8 thus has the serpentine arrangement of actuating and opposing segments illustrated in FIG. 1 wherein the opposing segments deflect or bend in a direction opposite to that of the actuating segments. The cross-sectional view of FIG. 8 illustrates an increase in the rotation of the free end 33" when compared with the free end 33' of FIG. 2. As with the actuators previously discussed, the actuator of FIG. 8 can be designed to assume a resting position substantially parallel with the substrate when not actuated.

The examples discussed above show that systems according to the present invention can be used to actuate micromechanical mirrors for applications such as scanners. Actuators according to the present invention, however, can also be used in other optical devices such as attenuators, shutters, and cross-connect switches. Actuators according to the present invention can also be used in other applications such as variable capacitors, variable inductors, switches, relays, or valves.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A micromechanical system comprising:
   a substrate;
   an actuator including a serpentine arrangement of alternating actuating and opposing segments anchored at a first end thereof to the substrate wherein the actuating segments deflect in response to actuation thereof so that a second end of the serpentine arrangement moves relative to the substrate upon deflection of the actuating segments wherein first and second actuating segments are on opposite sides of an opposing segment with a first end of the opposing segment being connected to an end of the first actuating segment, with a second end of the opposing segment being connected to an end of the second actuating segment, and with the opposing segment being free of support other than the connections at the first and second ends thereof; and
   an actuated element attached to the second end of the serpentine arrangement so that the actuated element moves relative to the substrate upon deflection of the actuating segments.

2. A micromechanical system according to claim 1 wherein each of the actuating segments comprises a bimorph segment including a first layer of a first material having a first coefficient of thermal expansion and a second layer of a second material having a second coefficient of thermal expansion different than the first coefficient of thermal expansion so that the actuating segments deflect in response to changes in temperature thereof.

3. A micromechanical system according to claim 1 wherein the alternating actuating and opposing segments comprise parallel beams.

4. A micromechanical system according to claim 3 wherein a second end of the serpentine arrangement rotates about an axis perpendicular to the parallel beams.

5. A micromechanical system according to claim 1 wherein the substrate includes a trench therein adjacent the serpentine arrangement.

6. A micromechanical system comprising:
   a substrate;
   an actuator including a serpentine arrangement of alternating actuating and opposing segments anchored at a first end thereof to the substrate wherein the actuating segments deflect in response to actuation thereof so that a second end of the serpentine arrangement moves relative to the substrate upon deflection of the actuating segments;
   an actuated element attached to the second end of the serpentine arrangement so that the actuated element moves relative to the substrate upon deflection of the actuating segments; and
   a second actuator including a second serpentine arrangement of alternating actuating and opposing segments anchored at a first end thereof to the substrate wherein the actuating segments deflect in response to actuation thereof so that a second end of the second serpentine arrangement moves relative to the substrate upon deflection of the actuating segments wherein the second end of the second serpentine arrangement is attached to the actuated element.

7. A micromechanical system according to claim 6 further comprising:
   an electrical path between the respective second ends of the first and second serpentine arrangements of the respective first and second actuators; and
   a signal generator coupled between the first ends of the first and second serpentine arrangements of the respective first and second actuators so that an electrical signal generated by the signal generator actuates the actuating segments of the first and second serpentine arrangements.

8. A micromechanical system according to claim 1 further comprising:
   a clamp that maintains a position of the actuated element relative to the substrate.

9. A micromechanical system according to claim 8 wherein the clamp comprises an electrostatic clamp.

10. A micromechanical system according to claim 1 wherein the opposing segments do not deflect significantly in response to actuation of the actuator.

11. A micromechanical system according to claim 1 wherein the actuating segments deflect in a first direction in response to actuation of the actuator and wherein the opposing segments deflect in a second direction opposite the first direction in response to actuation of the actuator.

12. An actuator comprising:
   a serpentine arrangement of alternating actuating and opposing segments wherein the actuating segments deflect in response to actuation thereof wherein first and second actuating segments are on opposite sides of an opposing segment with a first end of the opposing segment being connected to an end of the first actuating segment, with a second end of the opposing segment being connected to an end of the second actuating segment, and with the opposing segment being free of support other than the connections at the first and second ends thereof.

13. An actuator according to claim 12 wherein each of the actuating segments comprises a bimorph segment including a first layer of a first material having a first coefficient of thermal expansion and a second layer of a second material having a second coefficient of thermal expansion different than the first coefficient of thermal expansion so that the actuating segments deflect in response to changes in temperature thereof.

14. An actuator according to claim 12 wherein the alternating actuating and opposing segments comprise parallel beams.

15. An actuator according to claim 14 wherein a first end of the serpentine arrangement is anchored to a substrate and wherein a second end of the serpentine arrangement rotates about an axis perpendicular to the parallel beams.

16. An actuator according to claim 12 further comprising:
    a substrate with a first end of the serpentine arrangement anchored to the substrate wherein a second end of the serpentine arrangement moves relative to the substrate upon deflection of the actuating segments.

17. An actuator according to claim 16 further comprising:
    an actuated element attached to the second end of the serpentine arrangement so that the actuated element moves relative to the substrate upon deflection of the actuating segments.

18. An actuator according to claim 16 wherein the substrate includes a trench therein adjacent the serpentine arrangement.

19. An actuator according to claim 12 wherein the actuating segments deflect in response to changes in temperature thereof.

20. An actuator according to claim 12 wherein the opposing segments do not deflect significantly in response to actuation of the actuator.

21. An actuator according to claim 12 wherein the actuating segments deflect in a first direction in response to actuation of the actuator and wherein the opposing segments deflect in a second direction opposite the first direction in response to actuation of the actuator.

22. A method of forming a micromechanical system on a substrate, the method comprising the steps of:
    forming an actuator including a serpentine arrangement of alternating actuating and opposing segments anchored at a first end thereof to the substrate wherein the actuating segments deflect in response to actuation thereof so that a second end of the serpentine arrangement moves relative to the substrate upon deflection of the actuating segments; and
    forming an actuated element attached to the second end of the serpentine arrangement so that the actuated element moves relative to the substrate upon deflection of the actuating segments.

23. A method according to claim 22 wherein the step of forming the actuator comprises the steps of,
    forming an anchor on the substrate,
    forming a sacrificial layer on the substrate,
    forming the serpentine arrangement of alternating actuating and opposing segments on the sacrificial layer with the first end attached to the anchor, and
    after forming the serpentine arrangement, removing the sacrificial layer.

24. A method according to claim 22 wherein each of the actuating segments comprises a bimorph segment including a first layer of a first material having a first coefficient of thermal expansion and a second layer of a second material having a second coefficient of thermal expansion different than the first coefficient of thermal expansion so that the actuating segments deflect in response to changes in temperature thereof.

25. A method according to claim 22 wherein the alternating actuating and opposing segments comprise parallel beams.

26. A method according to claim 25 wherein a second end of the serpentine arrangement rotates about an axis perpendicular to the parallel beams.

27. A method according to claim 22 further comprising the step of:
    forming a trench in the substrate adjacent the serpentine arrangement.

28. A method according to claim 27 wherein the step of forming the trench follows the step of forming the actuator.

29. A method according to claim 22 further comprising the step of:
    forming a second actuator including a second serpentine arrangement of alternating actuating and opposing segments anchored at a first end thereof to the substrate wherein the actuating segments deflect in response to actuation thereof so that a second end of the second serpentine arrangement moves relative to the substrate upon deflection of the actuating segments wherein the second end of the second serpentine arrangement is attached to the actuated element.

30. A method according to claim 29 further comprising the step of:
    forming an electrical path between the respective second ends of the first and second serpentine arrangements of the respective first and second actuators; and
    forming a signal generator coupled between the first ends of the first and second serpentine arrangements of the respective first and second actuators so that an electrical signal generated by the signal generator actuates the actuating segments of the first and second serpentine arrangements.

31. A method according to claim 22 further comprising the step of:
    forming a clamp that maintains a position of the actuated element relative to the substrate.

32. A method according to claim 31 wherein the clamp comprises an electrostatic clamp.

33. A method according to claim 22 wherein the opposing segments do not deflect significantly in response to actuation of the actuator.

34. A method according to claim 22 wherein the actuating segments deflect in a first direction in response to actuation of the actuator and wherein the opposing segments deflect in a second direction opposite the first direction in response to actuation of the actuator.

35. A method of forming an actuator on a substrate, the method comprising the step of:
    forming a serpentine arrangement of alternating actuating and opposing segments anchored at a first end thereof to the substrate wherein the actuating segments deflect in response to actuation thereof so that a second end of the serpentine arrangement moves relative to the substrate upon deflection of the actuating segments wherein first and second actuating segments are on opposite sides of an opposing segment with a first end of the opposing segment being connected to an end of the first actuating segment, with a second end of the opposing segment being connected to an end of the second actuating segment, and with the opposing segment being free of support other than the connections at the first and second ends thereof.

36. A method according to claim 35 wherein the step of forming the serpentine arrangement comprises the steps of, forming an anchor on the substrate, forming a sacrificial layer on the substrate, forming the serpentine arrangement of alternating actuating and opposing segments on the sacrificial layer with the first end attached to the anchor, and after forming the serpentine arrangement, removing the sacrificial layer.

37. A method according to claim 35 wherein each of the actuating segments comprises a bimorph segment including a first layer of a first material having a first coefficient of thermal expansion and a second layer of a second material having a second coefficient of thermal expansion different than the first coefficient of thermal expansion so that the actuating segments deflect in response to changes in temperature thereof.

38. A method according to claim 35 wherein the alternating actuating and opposing segments comprise parallel beams.

39. A method according to claim 38 wherein the second end of the serpentine arrangement rotates about an axis perpendicular to the parallel beams.

40. A method of forming an actuator on a substrate, the method comprising the step of:

forming a serpentine arrangement of alternating actuating and opposing segments anchored at a first end thereof to the substrate wherein the actuating segments deflect in response to actuation thereof so that a second end of the serpentine arrangement moves relative to the substrate upon deflection of the actuating segments wherein the alternating actuating and opposing segments comprise parallel beams; and forming an actuated element attached to the second end of the serpentine arrangement so that the actuated element moves relative to the substrate upon deflection of the actuating segments.

41. A method of forming an actuator on a substrate, the method comprising the steps of:

forming a serpentine arrangement of alternating actuating and opposing segments anchored at a first end thereof to the substrate wherein the actuating segments deflect in response to actuation thereof so that a second end of the serpentine arrangement moves relative to the substrate upon deflection of the actuating segments; and forming a trench therein adjacent the serpentine arrangement.

42. A method according to claim 41 wherein the step of forming the trench follows the step of forming the serpentine arrangement.

43. A method according to claim 35 wherein the actuating segments deflect in response to changes in temperature thereof.

44. A method according to claim 35 wherein the opposing segments do not deflect significantly in response to actuation of the actuator.

45. A method according to claim 35 wherein the actuating segments deflect in a first direction in response to actuation of the actuator and wherein the opposing segments deflect in a second direction opposite the first direction in response to actuation of the actuator.

46. A method according to claim 22 wherein first and second actuating segments are on opposite sides of an opposing segment with a first end of the opposing segment being connected to an end of the first actuating segment, with a second end of the opposing segment being connected to an end of the second actuating segment, and with the opposing segment being free of support other than the connections at the first and second ends thereof.

47. A micromechanical system according to claim 1 wherein the opposing segment and the first and second actuating segments are parallel in a non-actuated state, wherein spacings between the opposing segment and the first actuating segment and between the opposing segment and the second actuating segment are less than lengths of the opposing segment, the first actuating segment, and second actuating segment, and wherein each of the first actuating segment and the second actuating segment deflect along the length thereof in response to actuation.

48. A micromechanical system according to claim 1 wherein the opposing segment and the first and second actuating segments are parallel in a non-actuated state and wherein the opposing segment and the first and second actuating segments are non-parallel in an actuated state.

49. A micromechanical system according to claim 12 wherein the opposing segment and the first and second actuating segments are parallel in a non-actuated state, wherein spacings between the opposing segment and the first actuating segment and between the opposing segment and the second actuating segment are less than lengths of the opposing segment, the first actuating segment, and second actuating segment, and wherein each of the first actuating segment and the second actuating segment deflect along the length thereof in response to actuation.

50. A micromechanical system according to claim 12 wherein the opposing segment and the first and second actuating segments are parallel in a non-actuated state and wherein the opposing segment and the first and second actuating segments are non-parallel in an actuated state.

51. A micromechanical system according to claim 35 wherein the opposing segment and the first and second actuating segments are parallel in a non-actuated state, wherein spacings between the opposing segment and the first actuating segment and between the opposing segment and the second actuating segment are less than lengths of the opposing segment, the first actuating segment, and second actuating segment, and wherein each of the first actuating segment and the second actuating segment deflect along the length thereof in response to actuation.

52. A micromechanical system according to claim 35 wherein the opposing segment and the first and second actuating segments are parallel in a non-actuated state and wherein the opposing segment and the first and second actuating segments are non-parallel in an actuated state.

53. A micromechanical system according to claim 46 wherein the opposing segment and the first and second actuating segments are parallel in a non-actuated state, wherein spacings between the opposing segment and the first actuating segment and between the opposing segment and the second actuating segment are less than lengths of the opposing segment, the first actuating segment, and second actuating segment, and wherein each of the first actuating segment and the second actuating segment deflect along the length thereof in response to actuation.

54. A micromechanical system according to claim 46 wherein the opposing segment and the first and second actuating segments are parallel in a non-actuated state and wherein the opposing segment and the first and second actuating segments are non-parallel in an actuated state.

* * * * *